(12) United States Patent
Poddar et al.

(10) Patent No.: US 6,933,597 B1
(45) Date of Patent: Aug. 23, 2005

(54) SPACER WITH PASSIVE COMPONENTS FOR USE IN MULTI-CHIP MODULES

(75) Inventors: Anindya Poddar, Sunnyvale, CA (US); Ashok S. Prabhu, San Jose, CA (US)

(73) Assignee: National Semiconductor Corporation, Santa Clara, CA (US)

( * ) Notice: Subject to any disclaimer, the term of this patent is extended or adjusted under 35 U.S.C. 154(b) by 300 days.

(21) Appl. No.: 10/192,173

(22) Filed: Jul. 9, 2002

(51) Int. Cl.[7] ............................................. H01L 23/02
(52) U.S. Cl. ..................................................... 257/686
(58) Field of Search ................................ 257/685, 686, 257/723–725

(56) References Cited

U.S. PATENT DOCUMENTS

| | | | | |
|---|---|---|---|---|
| 5,530,288 A | * | 6/1996 | Stone | ........................ 257/700 |
| 5,564,617 A | * | 10/1996 | Degani et al. | ............... 228/6.2 |
| 5,617,297 A | * | 4/1997 | Lo et al. | ..................... 361/737 |
| 5,625,235 A | | 4/1997 | Takiar | |
| 5,770,476 A | * | 6/1998 | Stone | ........................ 438/106 |
| 6,274,937 B1 | * | 8/2001 | Ahn et al. | ................... 257/777 |
| 6,351,028 B1 | * | 2/2002 | Akram | ....................... 257/686 |
| 6,555,902 B2 | * | 4/2003 | Lo et al. | ..................... 257/686 |
| 6,586,835 B1 | * | 7/2003 | Ahn et al. | ................... 257/717 |
| 6,671,947 B2 | * | 1/2004 | Bohr | ............................ 29/846 |
| 6,861,288 B2 | * | 3/2005 | Shim et al. | ................. 438/109 |

* cited by examiner

*Primary Examiner*—David A. Zarneke
(74) *Attorney, Agent, or Firm*—Beyer Weaver & Thomas, LLP

(57) ABSTRACT

A method for providing passive circuit functions in a multi-chip module and the multi-chip modules that result from incorporating these function is disclosed. Passive components such as resistors, capacitors and inductors are fabricated on or within a non-conductive spacer. The spacer is then placed between two active semiconductor dies and coupled electrically to either one or both of the dies. In this manner, area of the active dies that would normally have to be used for such passive components is freed for other uses and the spacer, which was already required in multi-chip modules, is endowed with extra functionality. In another embodiment, one or both surfaces of the spacer are coated with a conductive metal and the passive components are located within the spacer. In this embodiment, the spacer provides electromagnetic interference protection between the active dies.

9 Claims, 2 Drawing Sheets

SPACER WITH PASSIVE COMPONENTS FOR USE IN MULTI-CHIP MODULES

BACKGROUND OF THE INVENTION

This invention relates to the field of integrated circuits (ICs). More particularly, it relates to multi-chip modules and their fabrication.

Multi-chip modules are known within the semiconductor fabrication industry. In a multi-chip module, several semiconductor dies, each die consisting of active and passive components, are coupled together and incorporated into a single completed IC package. For purposes of this invention, any IC containing two or more separate semiconductor dies will be called a multi-chip module. Examples of known multi-chip modules include a first semiconductor die with digital circuitry coupled together with a semiconductor die having analog circuitry, the two dies together being mounted within a single IC package. Similarly, digital semiconductor memory dies can be coupled together in whatever multiple is practical (e.g. 2*64 Mbit) and placed within a single IC package to create a large multi-chip module memory that is larger than would be practical or economical to fashion on a single semiconductor die.

The multiple semiconductor dies that form the active circuitry of these multi-chip modules can be mounted next to one another in a single "layer" or they can be placed one atop another. The number of dies in either a horizontal layout multi-chip module or a vertical layout multi-chip module will be constrained by the difficulty of forming connections between the dies, the cost of forming a package around multiple dies, the availability of printed circuit board ("PCB") realty to mount the finished module and other, similar issues.

In multi-chip modules where the semiconductor dies are mounted one atop another, it is often necessary to place a non-conductive spacer between the active dies, to prevent short-circuits between them and to enable interconnection to the substrates. These spacers are typically formed from an inert insulating material like pure silicon, glass or a non-conductive polymer. Vias are created in these spacers to permit interconnections between the active dies that comprise the multi-chip module.

Although these known multi-chip modules are adequate for their intended uses, the insertion of spacers merely for insulation between active dies is wasteful of the module's internal area.

SUMMARY OF THE INVENTION

In a first embodiment of the present invention, a spacer containing embedded passive components such as resistors, inductors or capacitors is placed between the semiconductor dies bearing active components in a stacked die multi-chip module. These passive components can perform such tasks as noise filtering and/or signal filtering, electro-static discharge (ESD) protection, electromagnetic interference (EMI) protection and similar functions. By moving these functions to the previously inert spacer, the total internal volume of the multi-chip module is used more efficiently and the designers of the active dies have more design freedom, as the enumerated passive functions as well as other similar functions can be effected in the previously inert spacer. Several of the enumerated passive components also require a comparatively large amount of semiconductor die area to fabricate. Moving them to the spacer thus frees up very valuable semiconductor real estate on the active semiconductor dies.

Connections between the passive, embedded components on the spacer and the active dies can be accomplished in any of several known manners (e.g., solder bumps, wirebonds, vias, etc).

In another embodiment of the present invention, one side or both sides of the spacer with embedded passive components can be metal-plated. Such plating would allow the spacer to provide effective EMI protection between the active dies. The level of the shielding can be adjusted by coupling the shield to a ground voltage potential or a positive or negative voltage of predetermined level.

These embodiments will now be described in detail with reference to the figures listed and described below.

BRIEF DESCRIPTION OF THE DRAWINGS

The present invention is illustrated by way of example, and not by way of limitation, in the accompanying figures, in which like reference numerals refer to similar elements and in which.

DETAILED DESCRIPTION OF THE INVENTION

In the following description, numerous specific details are set forth in order to provide a thorough understanding of the present invention. It will be understood to one skilled in the art that the present invention may be practiced without some or all of these specific details. In some instances, well known processes have not been described in detail in order not to unnecessarily obscure the present invention.

Figure 1:
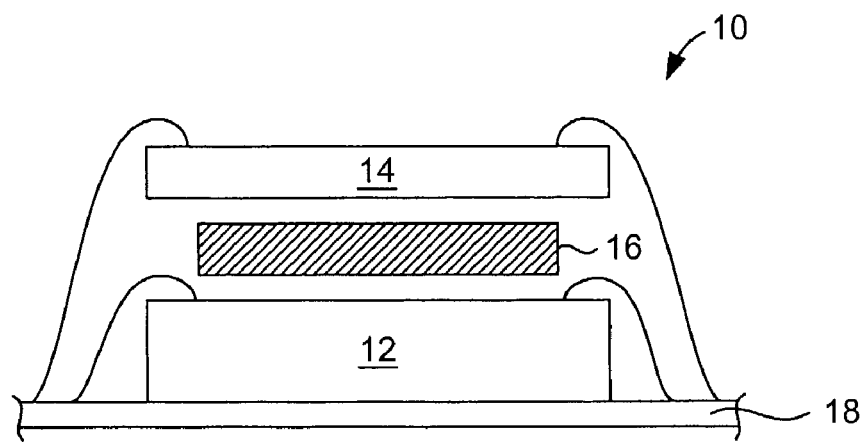
FIG. 1 is a diagrammatic cross sectional partial side view of the first embodiment of the present invention.

As shown in FIG. 1, multi-chip module 10 comprises two active dies, respectively 12 and 14, a spacer 16 with embedded passive components coupled, in this first embodiment, to die 12 and metal lead frame 18, upon which stacked dies 12 and 14 and spacer 16 are mounted and to which they are coupled. In this first embodiment, dies 12 and 14 are approximately the same size, with die 12 providing radio-frequency (RF) functionality and die 14 providing baseband functionality.

The completed multi-chip module would include a molded or cast body, made from any number of suitable materials including ceramics and plastics. That body is not illustrated in FIG. 1 or any of the other figures. The materials with which to fashion a package body for a multi-chip module as well as the process for creating the molded package body around a multi-chip module are known in the art and requires no further description here.

Spacer 16 is formed from an inert insulator such as pure silicon, glass, or polymer. One such polymer material is made by Micron Corp., but any appropriate inert material can be used.

Figure 2:
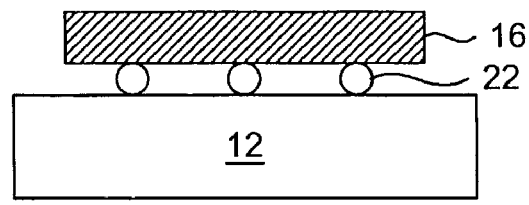
FIG. 2 is a detail of FIG. 1, showing how connections are made between the dies and the spacer.

FIG. 2 illustrates how spacer 16 might be electrically coupled to active die 12. Solder bumps 22 would be formed on the lower surface of spacer 16 and then a solder melting operation would create the connection with bond pads on active die 12. Die 14 would then be placed upon spacer 16 as shown in FIG. 1.

Figure 3:
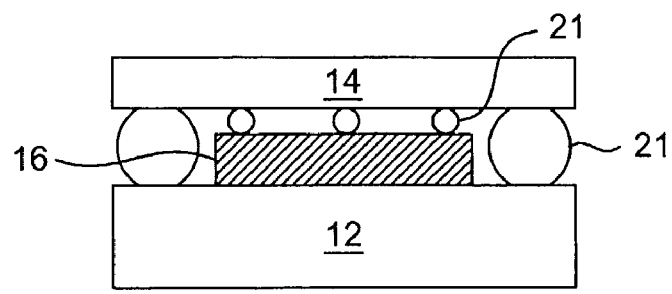
FIG. 3 is a detail of FIG. 1, showing an alternative arrangement of connections between the dies and spacer.

FIG. 3 illustrates how solder bumps 21 might be formed on the lower surface of active die 14, along with other larger solder bumps 23. The dies and spacer would then be stacked in the illustrated order and a solder melting operation would create electrical connections between die 14 and spacer 16.

Fabricating spacer 16 with passive components would involve similar processing operations to those required to fabricate an active semiconductor die. These photo-lithographic processes are known in the art and do not require description herein. It should be noted that the passive components that would be fabricated on the spacer, capacitors, inductors and/or resistors, typically require more area to create than is typically needed to fabricate an active component like a transistor. Consequently, moving these components to the spacer and off the active semiconductor dies frees a considerable amount of area on the dies, which simplifies the task of designing and fabricating the active dies. Depending upon the desired functionality of the passive circuitry on spacer 16, the spacer itself may have multiple layers. These passive components can serve as filters, voltage divider networks, ESD fuses and other, known functions that can be realized solely with passive components. It should also be noted that the components themselves will contribute to the shielding between the active semiconductor dies that the spacer provides.

Figure 4:
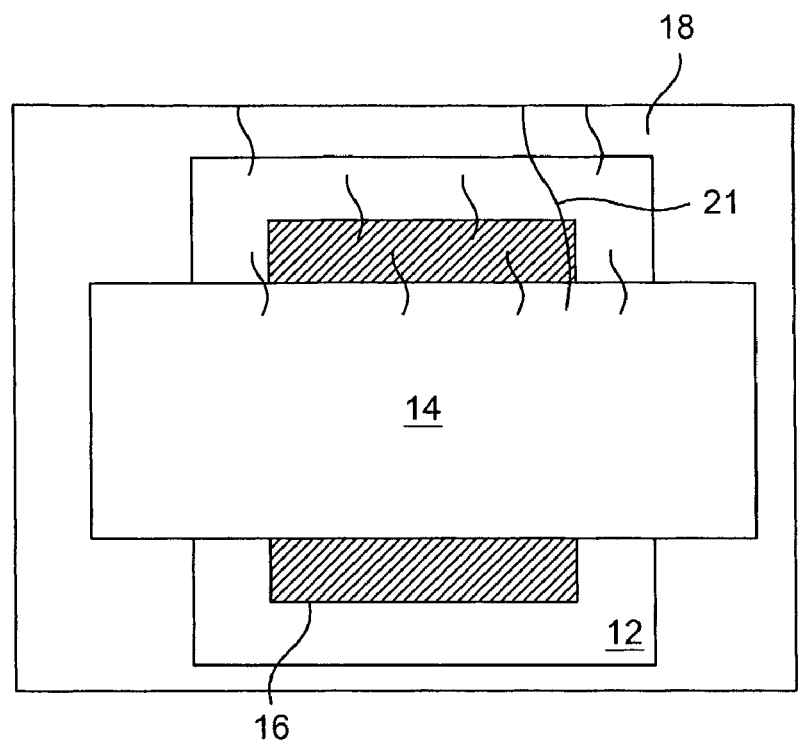
FIG. 4 is a top-down view of another embodiment of the present invention.

FIG. 4 shows an embodiment of the present invention where dies 12 and 14 as well as spacer 16 are all differently sized. In this embodiment, bond wires 21 couple each active die to the lead frame, as well as coupling each active die to spacer 16. Although bond wires are illustrated in this figure as the means for providing electrical connections between the dies, spacer and lead frame, such electrical connections could similarly be effected with solder bumps, vias or any of the known methods for providing such connections in the semiconductor fabrication field.

Figure 5:
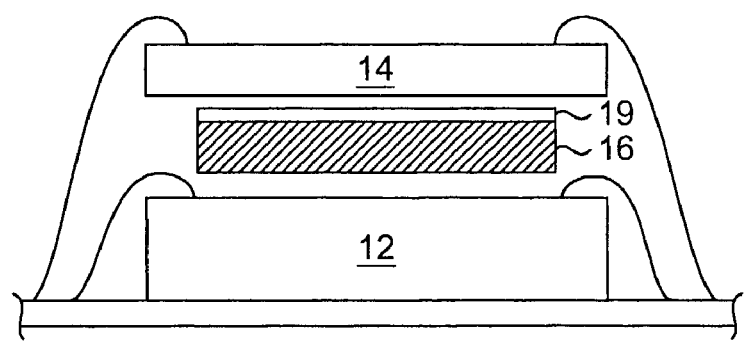
FIG. 5 is a diagrammatic cross sectional partial side view in accordance with a second embodiment of the present invention.

Another embodiment of the present invention is shown in FIG. 5. In this embodiment, the upper surface of spacer 16 is coated with a metal to form metal layer 19. In all other respect, the embodiment shown in FIG. 5 is the same as that shown in FIG. 1. Any metal with suitable working properties such as copper, aluminum or gold could be used. This list of suitable metals is not meant to be exhaustive. In this embodiment, metal layer 19 can be coupled to a predefined power supply voltage of any predefined value or to a ground potential. The choice of which voltage level will be dictated by several factors such as the amount of EMI shielding to provide and similar consideration. It is also envisioned that both surfaces of spacer 16 could be metal-coated and attached to the same or different voltage levels.

Although the foregoing invention has been described in some detail for purposes of clarity of understanding, it will be apparent that certain changes and modifications may be practiced within the scope of the appended claims. For example. It should be apparent that in most cases these processing techniques can be widely varied and a wide variety of alternative conventional processes may be used in their place. Accordingly, the present embodiments are to be considered as illustrative and not restrictive, and the invention is not to be limited to the details given herein, but may be modified within the scope and equivalents of the appended claims.

What is claimed is:

1. A stacked multi-chip module comprising:
    a first semiconductor die having an active surface with a plurality of I/O pads;
    a second active semiconductor die;
    a spacer having at least one passive device thereon, the spacer being situated between the first and second semiconductor die to provide a stacked chip arrangement and wherein the passive device is electrically coupled to at least one of the semiconductor die and the spacer is attached to the active surface of the first semiconductor die in a manner that leaves at least some of the I/O pads exposed;
    a carrier selected from the group consisting of a lead frame and a substrate, the carrier including electrically conductive contacts that are electrically coupled to the stacked chip arrangement, wherein the carrier is arranged to support the stacked arrangement; and
    a body that encloses the spacer, at least portions of the first and second semiconductor die and portions of the carrier while leaving the contacts exposed to facilitate electrical connection to external devices.

2. The multi-chip module of claim 1 wherein one surface of the spacer is coated with a conductive layer, the conductive layer being charged to a first predefined voltage level.

3. The multi-chip module of claim 1 wherein the spacer is fabricated from one of the group of materials comprising silicon, glass and quartz and passive devices are fabricated on the spacer using photo-lithographic methods.

4. The multi-chip module of claim 1 wherein a plurality of passive devices are provided on the spacer and at least some of the passive devices on the spacer are coupled to the first and second active semiconductor dies and filter signals sent between the first and second semiconductor dies.

5. The multi-chip module of claim 1 wherein;
    the carrier is a metal lead frame;
    a plurality of passive devices are provided on the spacer; and
    at least some of the passive components on the spacer are coupled to the first active semiconductor die and the metal lead frame and are arranged to provide electrostatic discharge protection for the first active semiconductor die.

6. The multi-chip module of claim 2 wherein opposing surfaces of the spacer are coated with a conductive layer and wherein both conductive layers are coupled to the same predefined voltage level.

7. The multi-chip module of claim 2 wherein opposing surfaces of the spacer are coated with a conductive layer and wherein the first and second conductive layers are coupled to different predefined voltage levels.

8. A spacer for use in a stacked multi-chip package, the spacer being suitable for insertion between a pair of stacked integrated circuit dice and sized such that when the spacer is coupled to an active surface of a first one of the stacked semiconductor dice at least some I/O pads on the active surface of the first semiconductor die remain exposed, the spacer comprising;
    a plurality of passive components; and
    at least one surface that is conductive, the conductive surface being coupled to a predetermined voltage level.

9. A stacked multi-chip package comprising:
    a first semiconductor die that includes an active surface having a plurality of I/O pads;

a spacer having at least one passive device thereon, the spacer having a footprint that is smaller than a footprint of the first semiconductor die and being attached to the active surface of the first semiconductor die in a manner that leaves at least some of the I/O pads exposed;

a second active semiconductor die attached to the spacer to provide a stacked chip arrangement with the spacer located between the first and second dice, wherein at least one of the passive devices is electrically coupled to at least one of the semiconductor dice;

a carrier selected from the group consisting of a lead frame and a substrate, the carrier including electrically conductive contacts that are electrically coupled to the stacked chip arrangement; and a body that encloses the spacer, at least portions of the first and second semiconductor die and portions of the carrier while leaving the contacts exposed to facilitate electrical connection to external devices.

* * * * *

UNITED STATES PATENT AND TRADEMARK OFFICE
CERTIFICATE OF CORRECTION

PATENT NO. : 6,933,597 B1
DATED : August 23, 2005
INVENTOR(S) : Poddar et al.

Page 1 of 1

It is certified that error appears in the above-identified patent and that said Letters Patent is hereby corrected as shown below:

<u>Column 4,</u>
Line 19, insert -- chip -- after "stacked".

Signed and Sealed this

Third Day of January, 2006

JON W. DUDAS
*Director of the United States Patent and Trademark Office*